United States Patent [19]

Madhu et al.

[11] Patent Number: 5,612,635
[45] Date of Patent: Mar. 18, 1997

[54] HIGH NOISE-MARGIN TTL BUFFER CIRCUIT CAPABLE OF OPERATION WITH WIDE VARIATION IN THE POWER SUPPLY VOLTAGE

[75] Inventors: Raghava Madhu, Trichur, India; Subramani Kengeri, Norwood, Mass.

[73] Assignee: Texas Instruments Incorporated, Dallas, Tex.

[21] Appl. No.: 408,514

[22] Filed: Mar. 22, 1995

[51] Int. Cl.$^6$ .............................................. H03K 19/0185
[52] U.S. Cl. ................................................ 326/71; 326/73
[58] Field of Search ................................ 326/63, 70, 71, 326/73–74

[56] References Cited

U.S. PATENT DOCUMENTS

| | | | |
|---|---|---|---|
| 4,216,390 | 8/1980 | Stewart | 326/63 |
| 5,036,226 | 7/1991 | Tonnu et al. | 326/73 |
| 5,276,366 | 1/1994 | Quigley et al. | 326/63 |

Primary Examiner—David R. Hudspeth
Attorney, Agent, or Firm—Robby T. Holland; William W. Holloway; Richard L. Donaldson

[57] ABSTRACT

A buffer circuit for converting logic signals generated by apparatus implemented in a TTL technology to logic signals processed by apparatus implemented by the CMOS technology includes an input stage (10, 11, 12, 13, 17), a voltage-control (14, 15) stage for causing the buffer circuit to vary the input voltage level required to switch the state of the buffer circuit output signal, and a hysteresis stage (16) for causing the switching of the output signal level to be different for the rising and falling edges of the input signal. The voltage-control stage (14, 15) provides a improvement in the noise margin of both the VTTL(High) switching level and the VTTL(Low) switching level.

20 Claims, 1 Drawing Sheet

HIGH NOISE-MARGIN TTL BUFFER CIRCUIT CAPABLE OF OPERATION WITH WIDE VARIATION IN THE POWER SUPPLY VOLTAGE

BACKGROUND OF THE INVENTION

1. Field of the Invention

This invention relates generally to integrated circuit random access memory (RAM) systems and, more particularly, to the interface buffer circuits which convert signals generated by circuits implemented using transistor-to-transistor logic (TTL) technology to signals compatible with circuits implemented in complementary metal oxides semiconductor (CMOS) technology. The CMOS technology is typically used to implement RAM and dynamic RAM (DRAM) memory arrays.

2. Description of the Related Art

The buffer circuits, which convert the signals generated by the data processing system apparatus implemented in TTL technology into signals compatible with the memory apparatus implemented in CMOS technology, are critical to successful operation of the system interface for the following reasons. The TTL buffer circuits provide the interface for all signals introduced into the memory component. A incorrect detection of a voltage (signal) level can result in a malfunction. One source of malfunction has, in the past, been the incorrect level detection resulting from variation in the power supply voltage. Similarly, noise on the supply and/or input signals can result in an incorrect interpretation of the logic level of the input signal. Being an interface, the speed with which the signals are converted from TTL-compatible to CMOS-compatible signals can provide a limitation in the system performance. In low power applications, the power dissipation, whether in a static mode or in a switching mode, can be a critical parameter. And finally, "ringing" in the input signal should be minimized in order to prevent oscillation of the internal signals.

In addition, when a large number of switching circuits and a full chip activation are required, more noise is generated than the buffer circuits disclosed by the related art are capable of handling. This is particularly true when a high noise margin is required for the input buffer circuit. Differential-type input buffer circuits provide the best noise margins, but have the disadvantage that these circuit require a higher die-area and result in a greater power dissipation than conventional buffer circuits.

A need has therefore been felt for a buffer circuit for providing an interface between the circuits implemented in TTL technology and circuits implemented in CMOS technology which have high noise margins, are relatively insensitive to power supply variations, operate at high speed, can be implemented on a relatively low die-area, do not require a stable reference level, and are relatively intolerant to ringing noise imposed on the input signals.

SUMMARY OF THE INVENTION

The aforementioned and other features are provided, according to the present invention, by a buffer circuit having an input stage, a voltage-control stage, and an output feedback stage. An input voltage applied to the input stage, in turn, causes a signal to be applied to a network node, the network node being the input terminal for the output feedback stage. The voltage level of the network node is determined by the voltage-control stage, the signal from the input stage, and the supply voltage. The output signal of the output feedback stage is determined by the voltage level of network node and the output signal of the buffer circuit is a logic level signal. The presence of the voltage-control stage results in an improvement in the noise margins of the buffer circuit.

These and other features of the present invention will be understood upon the reading of the following description in conjunction with the Figures.

DESCRIPTION OF THE PREFERRED EMBODIMENTS

Figure 1:
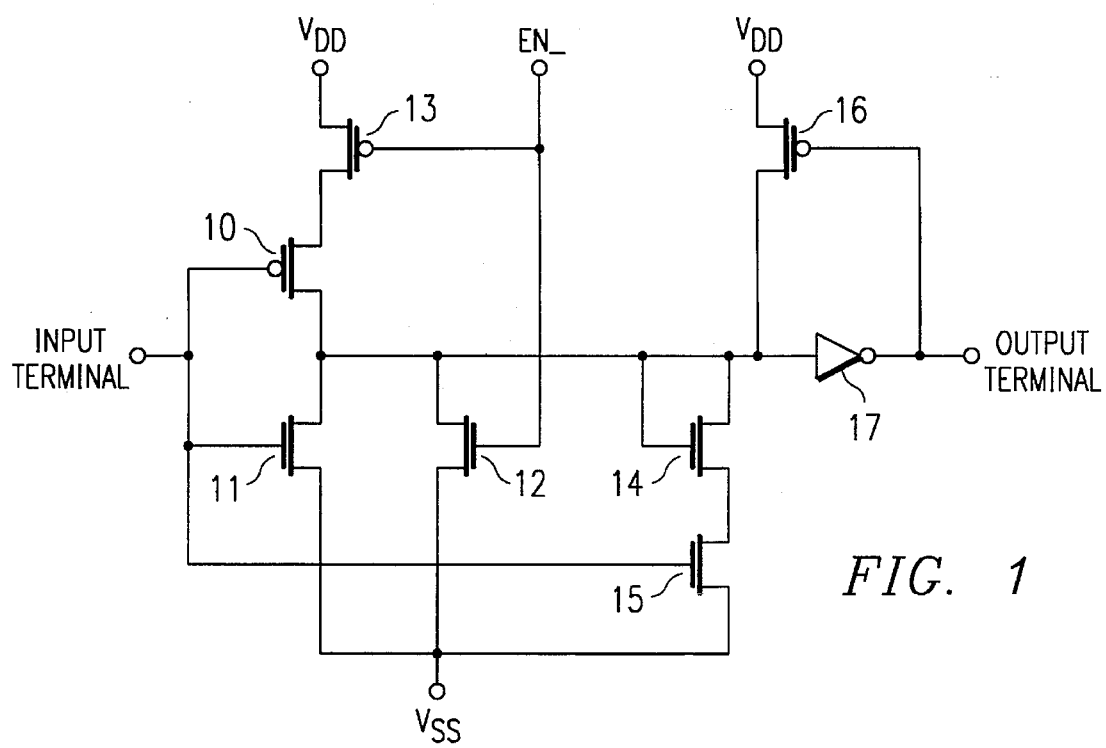
FIG. 1 is schematic circuit diagram of the TTL-to-CMOS buffer circuit responsive to a negative ENABLE signal according to the present invention.

1. Detailed Description of the Drawings Referring to FIG. 1, a schematic diagram of the TTL-to-CMOS buffer circuit responsive to a negative ENABLE (EN) signal, according to the present invention, is shown. An input terminal for receiving TTL-technology generated input signals is coupled to an gate terminal of p-channel transistor 10, to a gate terminal of n-channel transistor 11, and a gate terminal of n-channel transistor 15. A source terminal of transistor 11 is coupled to the VSS supply terminal, while a drain terminal of transistor 11 is coupled to a drain terminal of transistor 10, to a drain terminal of n-channel transistor 12, to a gate and a drain terminal of n-channel transistor 14, to a drain terminal of p-channel transistor 16, and to an input terminal of inverter amplifier 17. A source terminal of transistor 10 is coupled to a drain terminal of p-channel transistor 13. A gate terminal of transistor 13 is coupled to a gate terminal of transistor 12 and has the EN_signal applied thereto. (The SIGNAL_ indicates the logic signal complement of the SIGNAL.) The source terminal of transistor 13 is coupled to the VDD power supply terminal. The source terminal of transistor 12 is coupled to the VSS power supply terminal. The source terminal of transistor 15 is coupled to VSS while the drain terminal of transistor 15 is coupled to the source terminal of transistor 14o The source terminal of transistor 16 is coupled to the VDD power supply terminal, while the gate terminal of the transistor 16 is coupled to the output terminal of inverting amplifier 17. The output terminal of inverting amplifier 17 is the output terminal of the buffer circuit.

Figure 2:
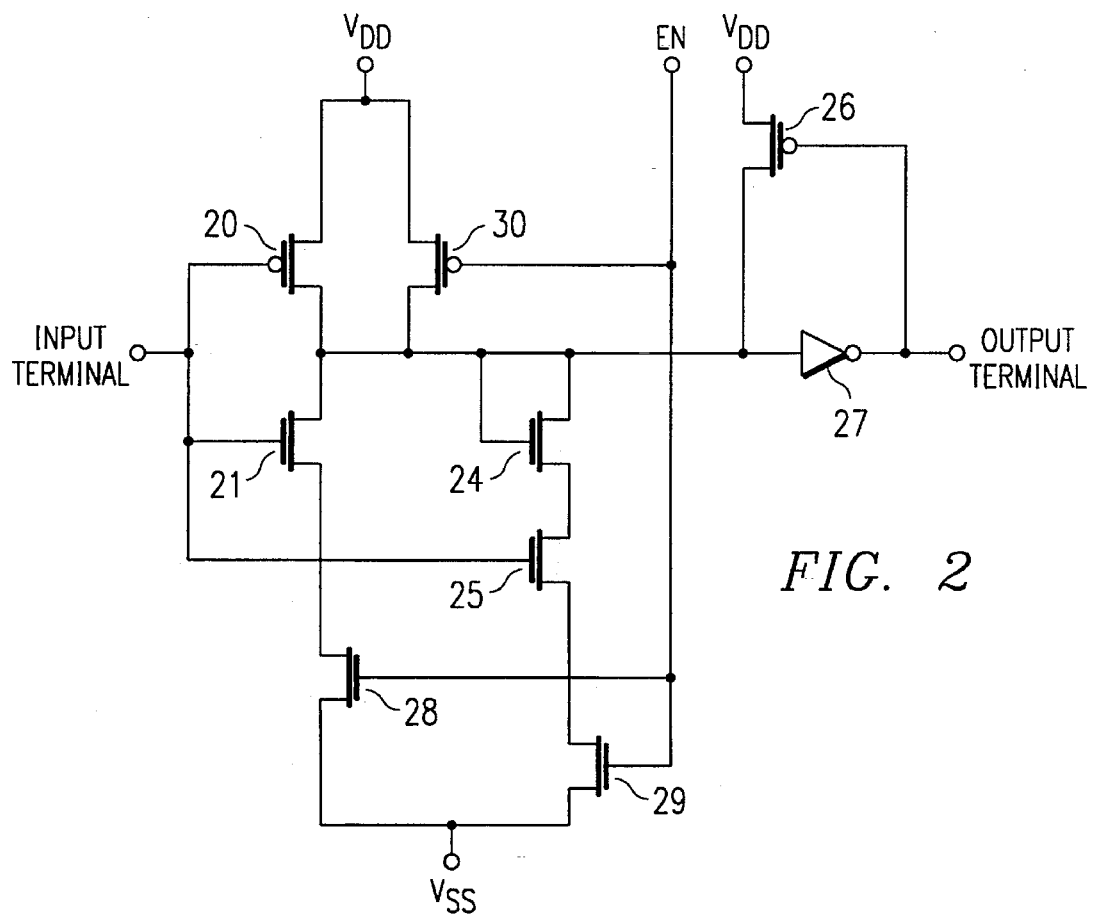
FIG. 2 is schematic circuit diagram of the TTL-to-CMOS buffer circuit responsive to a positive ENABLE signal according to the present invention.

Referring to FIG. 2, a schematic circuit diagram for a TTL-to-CMOS buffer circuit responsive to a positive ENABLE signal is shown. The input terminal is coupled to a gate of p-channel transistor 20, to a gate of n-channel transistor 21, and to a gate of n-channel transistor 25. An EN signal is coupled to a gate of n-channel transistor 28, to a gate terminal of n-channel transistor 29, and to a gate of p-channel transistor 30. The VDD supply terminal is coupled to a source terminal of transistor 20 and to a source terminal of transistor 30. A drain terminal of transistor 20 is coupled to a drain terminal of transistor 21, to a drain terminal of p-channel 26, to a drain terminal of transistor 30, to a gate and drain terminal of n-channel transistor 24, and to an input terminal of inverting amplifier 27. A source terminal of transistor 21 is coupled to a drain terminal of transistor 28. A source terminal of transistor 28 is coupled to the VSS supply terminal and to a source terminal of transistor 29. A drain terminal of transistor 29 is coupled to a source terminal of transistor 25. A source terminal of transistor 24 is couple to a drain terminal of transistor 25. A source terminal of transistor 26 is coupled to the VDD supply terminal, while the gate terminal of transistor 26 is coupled to the output terminal of inverting amplifier 27. The output terminal of inverting amplifier 27 is the output terminal of the buffer circuit.

2. Operation of the Preferred Embodiment(s)

Referring once again to FIG. 1, the buffer circuit responds to the identified TTL voltage levels wherein VTTL(High) =2.4 volts and VTTL(LOW)=0.8 volts. The buffer circuit is on, i.e., enabled, when EN_ is low. Transistors 13, 10, 11, 12, and 16 along with inverting amplifier 17 form an input buffer. In the default condition, when the applied TTL signal is greater than VTTL(High), transistor 11 causes the input terminal of the inverting amplifier 17 to be lowered, resulting in a high logic signal being applied to the output terminal of the buffer circuit. When the buffer circuit input voltage is less than VTTL(Low) (minus a hysteresis factor), transistor 10 becomes more conducting and the input terminal to the inverting amplifier 17 has a high level applied thereto. As a result, the output terminal of the buffer circuit has a low signal level applied thereto. This output signal level is fed-back through transistor 16 to enhance the high signal applied to the input terminal of inverting amplifier 17. This feedback path is used to create a hysteresis factor resulting in a switching of the signals applied to the output terminal at different points on the rising and falling edges of the buffer circuit input signal. This feature is essential in minimizing the effect of noise considerations. Without this hysteresis factor, the buffer circuit output signal would switch levels in response to ringing signals superimposed on the buffer circuit input signal.

The (diode-coupled) transistor 14 brings the level of VTTL(High) from −2.4 volts to −1.6 volts, the diode conduction being higher when the supply voltage (and hence the input terminal to inverting amplifier 17) is at a higher voltage. At lower supply voltages (where obtaining a better VTTL(Low) is a problem), the diode (transistor 14) path is less conducting resulting in a more sensitive transition. The diode (transistor 14) is coupled in series with transistor 15o Transistor 15 is controlled by the buffer circuit input signal so as to reduce current dissipation when the input signal is at a low level, i.e., transistor 10 is conducting.

The current path from the input terminal of inverting amplifier 17 to the VSS voltage supply terminal is completely cut-off when VTTL(Low)≦the threshold voltage of transistor 15. The degree of conduction of transistor 14 and transistor 15 is determined jointly by the voltage at the input terminal of inverting amplifier 17 and the level of the input signal controlling transistor 15.

The degree of conduction of transistor 14 dynamically increases the effective pull-down strength when the power supply voltage is high (because a higher supply voltage results in a higher voltage at the input terminal of inverting amplifier 17), and reduces the effective pull-down strength when the power supply voltage is low. The capability of dynamic variation in the strength of the pull-down is the primary reason for the excellent input noise margin over a wide range of power supply variations.

The (diode-coupled) transistor 14 and transistor 15 combination brings the VTTL(High) to a lower value without degrading the VTTL(Low), a distinct advantage over the buffer circuits of the related art. By controlling the voltage level at the input terminal of the inverting amplifier 17, the voltage at which the switching occurs can be controlled and the noise margin can be increased. For VTTL(High), the present invention provides a 500 mv improvement in the noise margin, while for VTTL(Low), the present invention provides an improvement in the noise margin of 100 mv.

Referring to FIG. 2, a buffer circuit is shown which is enabled by a positive enable signal. The operation is generally consistent with the operation of the buffer circuit shown in FIG. 1.

While the invention has been described with particular reference to the preferred embodiment, it will be understood by those skilled in the art that various changes may be made and equivalents substituted for elements of the preferred embodiment without departing from the invention. For example, the present invention has been described with particular reference to the particular embodiments shown in the Figures. However, additional driver components can be cascaded to in the output to suit the application. In addition, many modifications may be made to adapt a particular situation and material to a teaching of the present invention without departing from the essential teachings of the present invention.

As is evident from the foregoing discussion, certain aspects of the invention are not limited to the particular details of the examples illustrated, and it is accordingly intended that the claims shall cover all modifications and applications as do not depart from the spirit and scope of the invention.

What is claimed is:

1. A buffer circuit for converting first logic signal levels to second logic signal levels, said buffer circuit comprising:
   a circuit node;
   an input stage applying a node signal to said circuit node related to an input signal;
   a voltage-control stage responsive said first logic signal levels and a voltage level energizing said buffer circuit for determining, along with said node signal, a voltage level of said circuit node; and
   a feedback output stage responsive to a voltage of said circuit node for determining an output state of said buffer circuit.

2. The buffer circuit of claim 1 wherein said feedback output stage provides a hysteresis function whereby a buffer circuit output voltage switches at different input signal voltage levels for rising and falling voltages.

3. The buffer circuit of claim 2 wherein said first signal logic levels are generated by circuits implemented in TTL technology and the second logic signal levels are used in circuits implemented in CMOS technology.

4. The buffer circuit of claim 3 wherein said voltage-control stage includes a series-coupled transistor and diode combination coupled between a power supply and said network node.

5. The buffer circuit of claim 4 wherein said diode is a diode-coupled transistor.

6. The buffer circuit of claim 5 wherein said transistor has input signal applied to a gate terminal thereof.

7. The buffer circuit of claim 6 wherein said voltage-control stage improves the noise margin of the buffer circuit.

8. The method of converting first logic level signals into second logic level signals, said method comprising the steps of:
   controlling a voltage level of a network node in response to said first logic level signals and an energizing voltage level;
   applying a intermediate signal resulting from application of an input signal to said network node; and applying a resulting signal resulting from said voltage level and said intermediate signal to a feedback circuit, said feedback circuit providing a second logic level signal, wherein said feedback circuit provides a hysteresis resulting in a switching of second output level logic signals at different input signal levels for rising and for falling input signal levels.

9. The method of claim 8 wherein said controlling step includes the step of controlling said network node logic signal with a series combination of a transistor and a diode coupled between said network node and a voltage supply terminal, said transistor having said input signal applied thereto.

10. The method of claim 9 wherein said converting is activated by an enabling signal.

11. The method of claim 10 wherein said controlling step includes the step of improving noise margins for said first level logic signals.

12. A buffer circuit for converting first level logic signals to second level logic signals, said buffer circuit comprising:
   a feedback stage responsive to a combined signal applied to an input terminal of said feedback stage for determining a second level logic signal, said feedback stage switching said second logic signal at different combined signal voltage levels for rising and falling voltages;
   a voltage-control network responsive to Said first logic level signals and to a voltage level energizing said buffer circuit for establishing a voltage level at said input terminal; and
   an input stage responsive to first level logic signals for applying an intermediate signal to said input terminal, said intermediate signal and said voltage level providing said combined signal.

13. The buffer circuit of claim 12 wherein said voltage-control network includes a series-coupled transistor and diode coupled between said input terminal and a voltage supply terminal.

14. The buffer circuit of claim 13 wherein said voltage-control network improves the noise margins for said first signal level logic signals.

15. The buffer circuit of claim 14 wherein said transistor has said first level logic signal applied thereto.

16. The buffer circuit of claim 15 wherein said first logic level signals are generated by TTL circuits and said second logic level signals are compatible with CMOS technology.

17. The buffer circuit of claim 13 wherein said diode is a diode-coupled transistor.

18. The buffer circuit of claim 15 wherein said input stage includes three transistors coupled in series, a first and a second of said three transistors having said first level logic signal applied thereto, a third of said three transistors having said enable signal applied thereto.

19. The buffer circuit of claim 18 wherein said input stage includes a fourth transistor coupled between said input terminal and a supply terminal, said fourth transistor having said enable signal applied thereto.

20. The buffer circuit of claim 19 wherein said feedback stage includes:
   an inverting amplifier; and
   a transistor coupled between an input terminal and an output terminal of said inverting amplifier.

* * * * *